United States Patent
Chiu

(10) Patent No.: US 11,882,671 B2
(45) Date of Patent: Jan. 23, 2024

(54) LIQUID COOLING LOOP HEAT DISSIPATING DEVICE AND HEAT DISSIPATING SYSTEM THEREOF

(71) Applicant: NIDEC CHAUN-CHOUNG TECHNOLOGY CORPORATION, New Taipei (TW)

(72) Inventor: Yao-Tsung Chiu, New Taipei (TW)

(73) Assignee: NIDEC CHAUN-CHOUNG TECHNOLOGY CORPORATION, New Taipei (TW)

( * ) Notice: Subject to any disclaimer, the term of this patent is extended or adjusted under 35 U.S.C. 154(b) by 371 days.

(21) Appl. No.: 17/315,243

(22) Filed: May 7, 2021

(65) Prior Publication Data

US 2022/0361368 A1 Nov. 10, 2022

(51) Int. Cl.
*H05K 7/20* (2006.01)

(52) U.S. Cl.
CPC ..... *H05K 7/20272* (2013.01); *H05K 7/20927* (2013.01)

(58) Field of Classification Search
CPC ........... H05K 7/20272; H05K 7/20927; H05K 7/20254; H05K 7/20263; H05K 7/202; H05K 7/20154
USPC ...................................................... 165/80.4
See application file for complete search history.

(56) References Cited

U.S. PATENT DOCUMENTS

| | | | |
|---|---|---|---|
| 8,953,320 B2 * | 2/2015 | Campbell | F28D 15/046 165/185 |
| 10,085,367 B2 * | 9/2018 | Chainer | H05K 7/20327 |
| 10,667,434 B1 * | 5/2020 | Mao | H05K 7/20772 |
| 2019/0182988 A1 * | 6/2019 | Lunsman | H05K 7/20281 |
| 2021/0088287 A1 * | 3/2021 | Lan | F04B 23/04 |
| 2021/0307198 A1 * | 9/2021 | Chen | H05K 7/20272 |
| 2021/0307210 A1 * | 9/2021 | Wong | H05K 7/20327 |
| 2021/0321542 A1 * | 10/2021 | Edmunds | H01L 23/4735 |
| 2021/0352830 A1 * | 11/2021 | Varela Benitez | G06F 1/183 |
| 2023/0171921 A1 * | 6/2023 | Field | H05K 7/20272 700/300 |
| 2023/0194177 A1 * | 6/2023 | Huang | F28D 1/02 165/67 |

* cited by examiner

*Primary Examiner* — Claire E Rojohn, III
(74) *Attorney, Agent, or Firm* — Chun-Ming Shih; HDLS IPR SERVICES

(57) ABSTRACT

A heat dissipating device includes a power distribution assembly and two convergence delivery assemblies. The power distribution assembly includes a first cooling reservoir, a second cooling reservoir, multiple cooling pumps disposed on the first cooling reservoir, and a serial pipeline and a cooling head corresponding to each of the cooling pumps respectively. The two convergence delivery assemblies separately communicate with first cooling reservoir and the second cooling reservoir, and are separately arranged on two sides of the power distribution assembly. The serial pipeline is connected with the cooling head to communicate between the first cooling reservoir and the second cooling reservoir.

4 Claims, 6 Drawing Sheets

LIQUID COOLING LOOP HEAT DISSIPATING DEVICE AND HEAT DISSIPATING SYSTEM THEREOF

BACKGROUND

Technical Field

The disclosure relates to a heat dissipating device, particularly to a liquid cooling loop heat dissipating device and a heat dissipating system thereof.

Related Art

A related-art water cooling heat dissipating device or system for electronic heat-generating apparatuses separately delivers coolant to a cooling head of each server through a water tank. Each cooling head is connected through a cycle loop communicating with the water tank, so that the coolant is delivered to the cooling head of corresponding heat source. As a result, after the cooling head absorbs the heat from the heat source, the coolant is delivered back to the water tank to be cooled.

A related-art cycle loop in a server module usually uses a single pump to deliver coolant in a specific direction. However, with the increase of the components in a server, the structure of multiple cooling heads connected in series is adopted. A single pump configured in series may reduce the propulsion of coolant flow. Adding pumps alone is also hard to effectively perform full power of each pump and makes the flow of coolant be ununiformly.

SUMMARY

An object of the disclosure is to provide a liquid cooling loop heat dissipating device and a heat dissipating system thereof, which utilizes the arrangement of multiple pumps to be advantageously installed in a limited space and to effectively supply the delivery power of coolant to accurately control the flow.

To accomplish the above object, the disclosure provides a liquid cooling loop heat dissipating device, which includes a power distribution assembly and two convergence delivery assemblies. The power distribution assembly includes a first cooling reservoir, a second cooling reservoir, multiple cooling pumps disposed on the first cooling reservoir, and a serial pipeline and a cooling head separately corresponding to each of the cooling pumps. The two convergence delivery assemblies separately communicate with first cooling reservoir and the second cooling reservoir and are separately arranged on two sides of the power distribution assembly. The serial pipeline is connected with the cooling head in series to communicate between the first cooling reservoir and the second cooling reservoir.

To accomplish the object, the disclosure provides a liquid cooling loop heat dissipating system, which includes a console box, multiple casings and two divergence assemblies. The casings are vertically stacked with each other to be together disposed on the console box. Each casing is provided with a liquid cooling loop heat dissipating device. The two divergence assemblies are disposed outside a side of the casings being stacked and communicate with the liquid cooling loop heat dissipating device in each casing. The liquid cooling loop heat dissipating device includes a power distribution assembly and two convergence delivery assemblies. The power distribution assembly includes a first cooling reservoir, a second cooling reservoir, multiple cooling pumps disposed on the first cooling reservoir, and a serial pipeline and a cooling head separately corresponding to each of the cooling pumps. The serial pipeline is connected with the cooling head in series to communicate between the first cooling reservoir and the second cooling reservoir. The two convergence delivery assemblies separately communicate with first cooling reservoir and the second cooling reservoir and are separately arranged on two sides of the power distribution assembly.

In view of this, the inventors have devoted themselves to the abovementioned related art, researched intensively and cooperated with the application of science to try to solve the abovementioned problems. Finally, the invention which is reasonable and effective to overcome the above drawbacks is provided.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
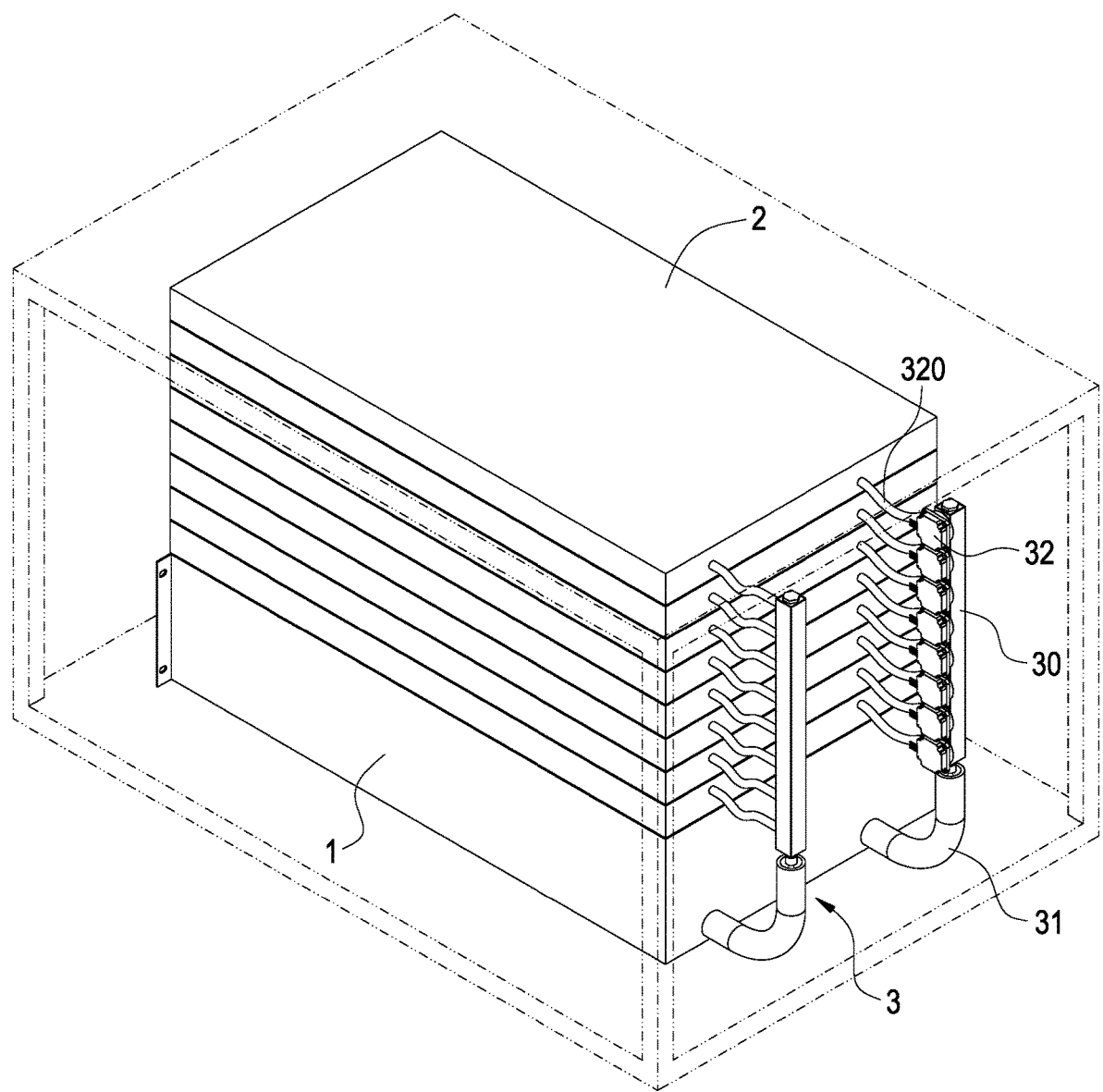
FIG. 1 is a perspective schematic view of the liquid cooling loop heat dissipating device heat dissipating system of the disclosure.
Figure 2:
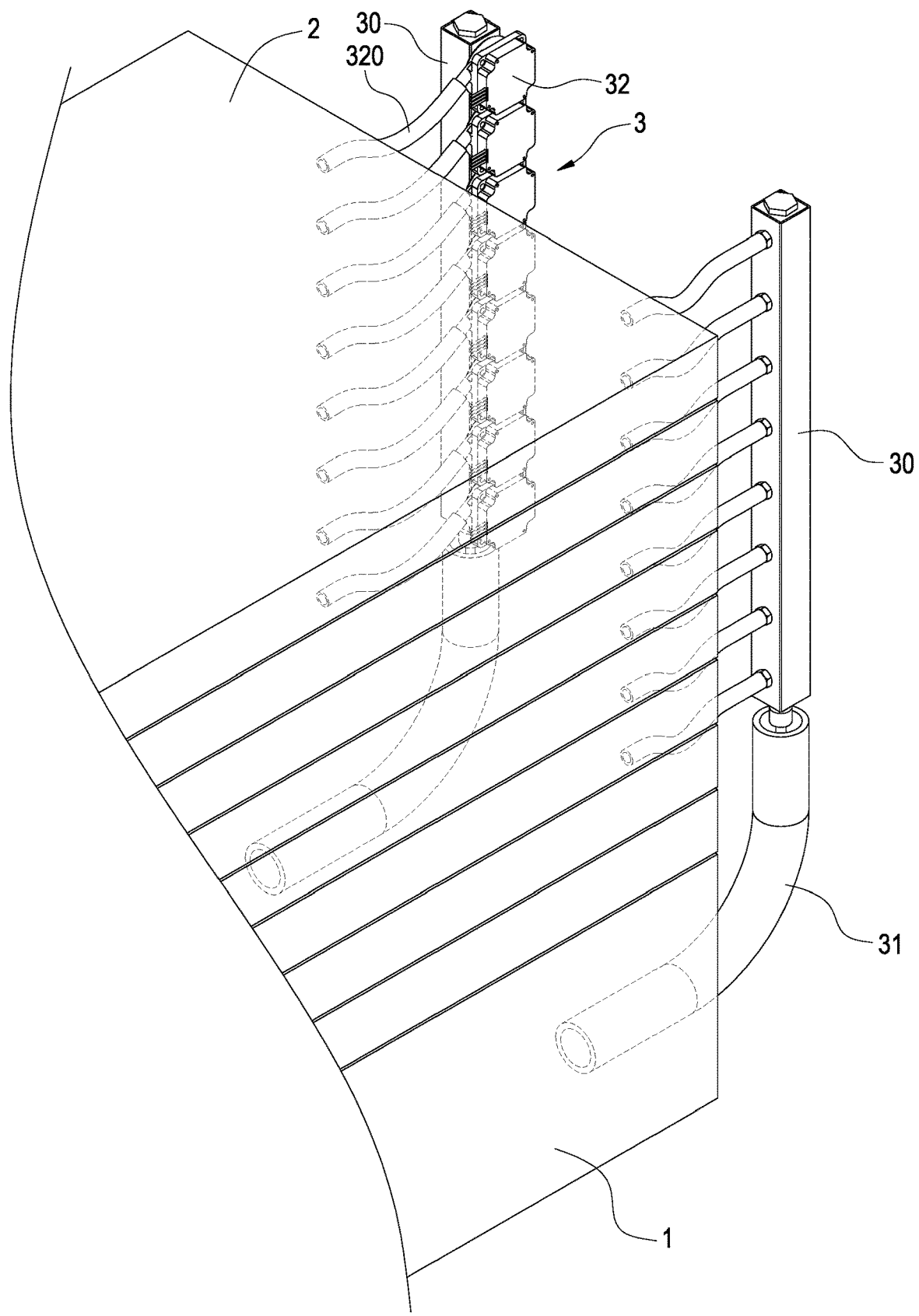
FIG. 2 is a partially enlarged view of the liquid cooling loop heat dissipating device heat dissipating system of the disclosure.

Please refer to FIGS. 1-2, which are a perspective schematic view and a partially enlarged view of the liquid cooling loop heat dissipating device heat dissipating system of the disclosure, respectively.

The disclosure provides a liquid cooling loop heat dissipating device and a heat dissipating system thereof. The liquid cooling loop heat dissipating system includes a console box 1, multiple casings 2 stacked on the console box 1 and at least two divergence assemblies 3 separately communicating between the console box 1 and each casing 2. The liquid cooling loop heat dissipating device 4 is disposed in each casing 2 and communicates with the two divergence assemblies 2.

The console box 1 may be a water tank, or a case with the assemblies, such as a main pump, a water tank and a heat exchanger, etc., disposed inside. Furthermore, the console box 1 may be provided with a cooling distribution unit (CDU) for controlling the operation of the pumps and detecting the efficiency of heat exchange.

Figure 3:
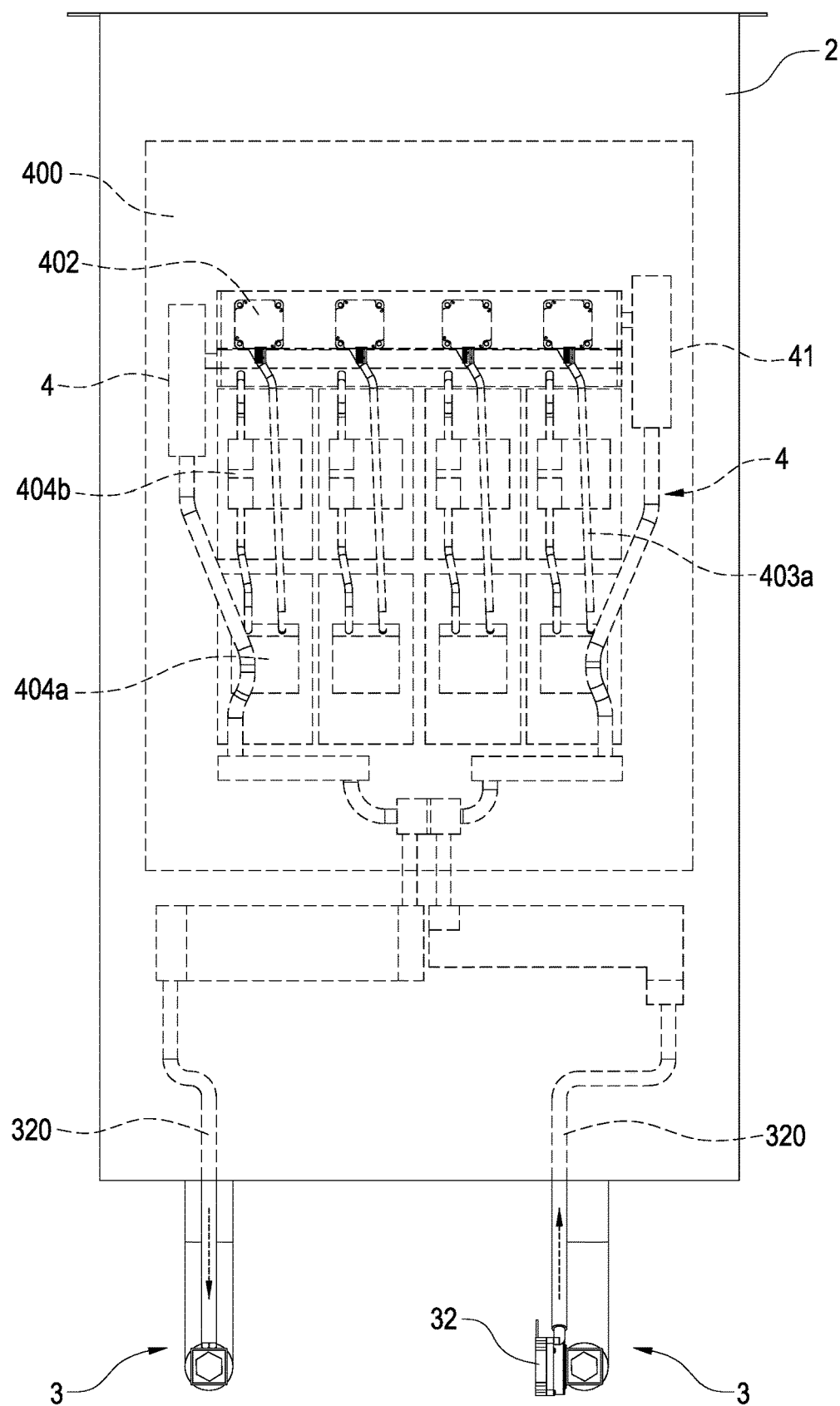
FIG. 3 is a schematic plan view of the liquid cooling loop heat dissipating device cooling device of the disclosure disposed in a module.

Please further refer to FIG. 3. The inside of the casing 2 may be provided with an electronic operating unit such as a sever board 20. The casings 2 are vertically stacked with each other to be together disposed on the console box 1. The liquid cooling loop heat dissipating device 4 is disposed in each casing 2. The liquid cooling loop heat dissipating device 4 communicates with the two divergence assemblies 3. The coolant in the console box 1 is delivered to the liquid cooling loop heat dissipating device 4 by the divergence assemblies 3 to perform heat dissipation to the electronic operating unit such as the server board.

Please refer to FIGS. 1-2. The two divergence assemblies 3 are disposed outside a side of the casings 2 being stacked. The two divergence assemblies 3 may be located on the same side or different sides. Each divergence assembly 3 has a diverging reservoir 30, a connecting tube 31 communicating from the console box 1 to the diverging reservoir 30, and multiple diverging pumps 32 disposed on the diverging reservoir 30. The diverging reservoir 30 is of a rod shape along the stacked direction of the casings 2 for the diverging pumps 32 to be sequentially mounted thereon for power communication. Each diverging pump 32 has a curved tube 320 communicating to the inside of corresponding casings 2 respectively and connecting with the liquid cooling loop heat dissipating device 4 as shown in FIG. 3 respectively.

Figure 4:
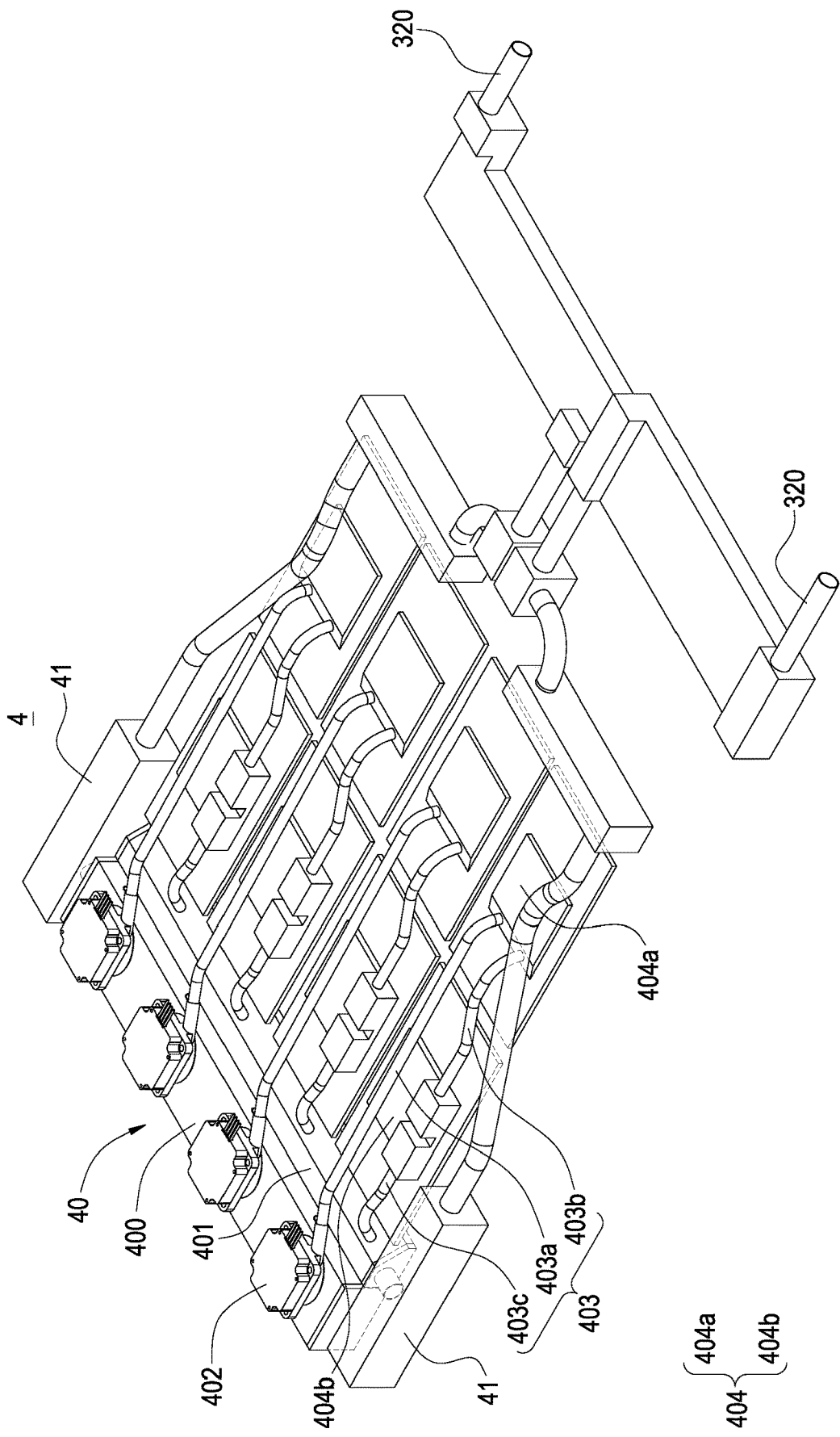
FIG. 4 is perspective schematic view of the liquid cooling loop heat dissipating device cooling device of the disclosure.
Figure 5:
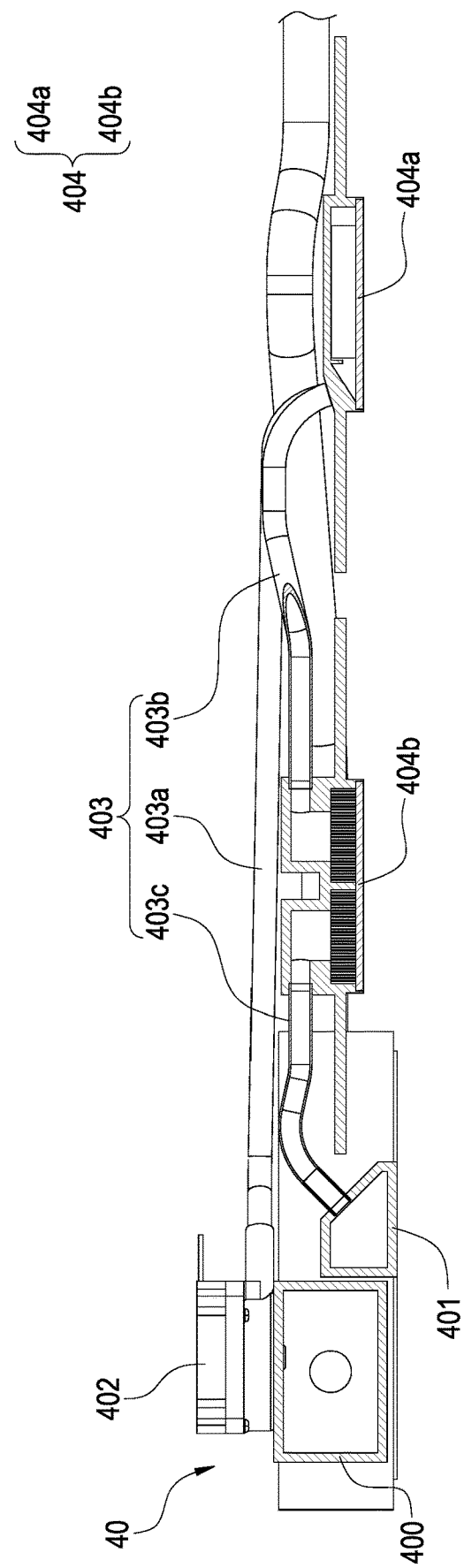
FIG. 5 is a partially cross-sectional schematic view of the liquid cooling loop heat dissipating device cooling device of the disclosure.

Please refer to FIGS. 3-5. The liquid cooling loop heat dissipating device 4 includes a power distribution assembly 40 and two convergence delivery assemblies 41. The power distribution assembly 40 includes a first cooling reservoir 400, a second cooling reservoir 401, multiple cooling pumps 402 disposed on the first cooling reservoir 400, and a serial pipeline 403 and a cooling head 404 separately corresponding to each of the cooling pumps 402. The two convergence delivery assemblies 41 separately communicate with first cooling reservoir 400 and the second cooling reservoir 401 and are separately arranged on two sides of the power distribution assembly 40 so as to be extended to the two divergence assemblies 3 to communicate with the curve tubes 320 of the diverging pumps 32 for providing the coolant to perform circular heat dissipation. In detail, the serial pipeline 403 may be divided into a first pipeline 403a, a second pipeline 403b and a third pipeline 403c. The cooling head 404 may be multiple in number depending on the required heat source, for example, a first cooling head 404a and a second cooling head 404b communicate between the first cooling reservoir 400 and the second cooling reservoir 401 through the first, second and third pipelines 403a, 403b and 403c connected in series to make each cooling pump 402 provide required coolant driving power to each serial pipeline 403. Also, the coolant may be converged and diverged. Further, the first cooling reservoir 400 and the second cooling reservoir 401, which are disposed on two sides of the power distribution unit 40, may serve the flowing-in and flowing-out of the coolant and communicate with the two divergence assemblies 3 to configure a circular loop without affecting the arrangement of the serial pipeline 403 and the cooling head 404 corresponding to each heat source. Also, each cooling pump 402 in the circular loop may control the driving power to the coolant in each serial pipeline 403 to be consistent to accomplish the object of uniform cooling and heat dissipation.

Figure 6:
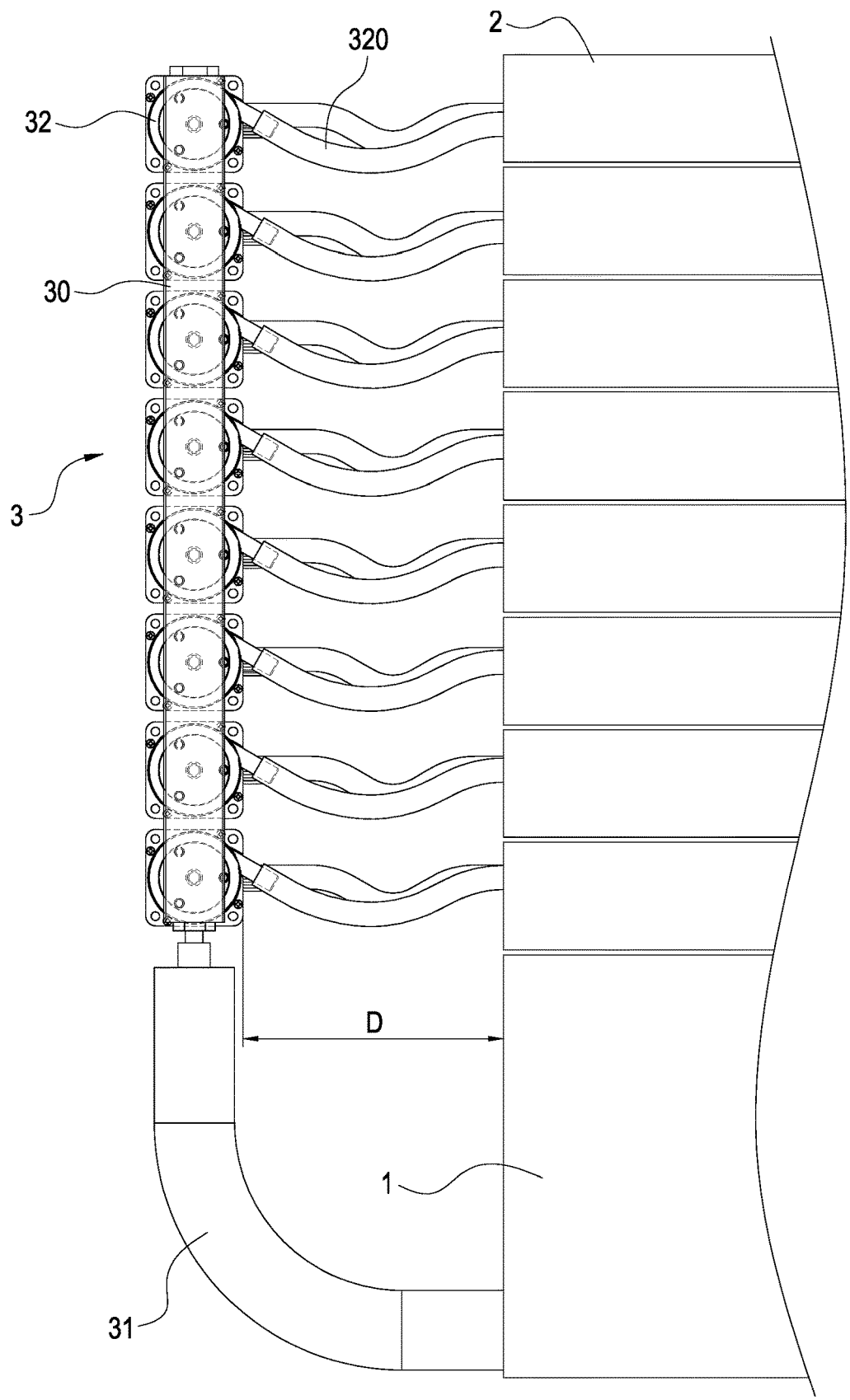
FIG. 6 is a schematic view of the distribution assembly of the disclosure.

As shown in FIG. 5, the second cooling reservoir 401 and the first cooling reservoir 400 may be horizontally arranged in a side by side manner and the second cooling reservoir 401 is located at a lower position on an inner side of the first cooling reservoir 400 for the cooling pumps 402 to be disposed above the first cooling reservoir 400. Also, the first pipeline 403a may be higher than the second and third pipelines 403b, 403c and the cooling heads 404 to be advantageous on recirculation. The second, third pipelines 403b, 403c may have a curved section respectively for connecting to the second cooling reservoir 401 at the lower position. In addition, as shown in FIG. 6, the diverging pumps 32 of the divergence assemblies 3 are arranged on a side of the diverging reservoir 30. The side indicates a lateral position of the diverging reservoir 30 facing the casings 2, for example, the sides of the diverging reservoirs 30 of the two divergence assemblies 3 facing each other. Of course, the diverging pumps 32 may be arranged on the sides opposite to each other (i.e., the outer side of the diverging reservoir 30), or arranged on an interlaced manner of the combination of aforementioned arrangement. As a result, a distance D between the diverging reservoir 30 of each divergence assembly 3 and the casing 2 is wider to facilitate the arrangement of the curved tube 320. Thus, the curved tube 320 has sufficient length for the diverging pump 32 to pump the coolant into the liquid cooling loop heat dissipating device 4 or to pump the coolant from the liquid cooling loop heat dissipating device 4 to the diverging reservoir 30.

Therefore, by the abovementioned structure, the liquid cooling loop heat dissipating device and the heat dissipating system of the disclosure are obtained.

While this disclosure has been described by means of specific embodiments, numerous modifications and variations could be made thereto by those skilled in the art without departing from the scope and spirit of this disclosure set forth in the claims.

What is claimed is:

1. A liquid cooling loop heat dissipating device comprising:
   a power distribution assembly, comprising a first cooling reservoir, a second cooling reservoir, multiple cooling pumps disposed on the first cooling reservoir, and a serial pipeline and a cooling head corresponding to each of the cooling pumps; and
   two convergence delivery assemblies, communicating with the first cooling reservoir and the second cooling reservoir, and arranged on two sides of the power distribution assembly;
   wherein the serial pipeline is connected with the cooling head in series to communicate between the first cooling reservoir and the second cooling reservoir,
   the second cooling reservoir and the first cooling reservoir are horizontally arranged, and the second cooling reservoir is located adjacent to the first cooling reservoir,
   the second cooling reservoir and the first cooling reservoir are sandwiched between the two convergence delivery assemblies,
   one of the two convergence delivery assemblies is arranged on one side of the first cooling reservoir and communicates with the first cooling reservoir, another one of the two convergence delivery assemblies communicates with the second cooling reservoir.

2. The liquid cooling loop heat dissipating device of claim 1, wherein the serial pipeline comprises a first pipeline, a second pipeline, and a third pipeline, an amount of the cooling head is multiple, and the multiple cooling heads are connected in series by the first pipeline, the second pipeline, and the third pipeline.

3. The liquid cooling loop heat dissipating device of claim 1, wherein a position of the second cooling reservoir is lower than a position of the first cooling reservoir.

4. The liquid cooling loop heat dissipating device of claim 1, wherein the cooling pumps are disposed above the first cooling reservoir.

* * * * *